United States Patent [19]

Katsura et al.

[11] Patent Number: 4,897,172

[45] Date of Patent: Jan. 30, 1990

[54] SPUTTERING CHAMBER STRUCTURE FOR HIGH-FREQUENCY BIAS SPUTTERING PROCESS

[75] Inventors: Toshihiko Katsura; Masahiro Abe, both of Yokohama, Japan

[73] Assignee: Kabushiki Kaisha Toshiba, Kawasaki, Japan

[21] Appl. No.: 236,384

[22] Filed: Aug. 24, 1988

[30] Foreign Application Priority Data

Mar. 26, 1987 [JP] Japan .................................. 62-211607

[51] Int. Cl.⁴ .............................................. C23C 14/44
[52] U.S. Cl. .................................. 204/298; 204/192.22
[58] Field of Search ................ 204/298 TT, 298 MS, 204/298 TS, 298 WH, 192.22

[56] References Cited

U.S. PATENT DOCUMENTS

| | | | |
|---|---|---|---|
| 3,558,467 | 1/1971 | Jackson | 204/298 |
| 4,094,764 | 6/1978 | Boucher et al | 204/298 |
| 4,525,262 | 6/1985 | Class et al. | 204/192.12 |

FOREIGN PATENT DOCUMENTS

| | | | |
|---|---|---|---|
| 56-21836 | 5/1981 | Japan | 204/298 |
| 58-164228 | 9/1983 | Japan | 204/298 |
| 59-17236 | 1/1984 | Japan | 204/298 |
| 60-197873 | 10/1985 | Japan | 204/298 |
| 62-167876 | 7/1987 | Japan | 204/298 |
| 62-284074 | 12/1987 | Japan | 204/298 |

*Primary Examiner*—Aaron Weisstuch
*Attorney, Agent, or Firm*—Finnegan, Henderson, Farabow, Garrett and Dunner

[57] ABSTRACT

A sputtering chamber structure is used to effect a high-frequency bias sputtering process and includes target and semiconductor electrodes, a metal protection plate formed to surround said target and having a first opening facing the front surface of the target, and a vacuum chamber for receiving the electrodes and the protection plate in a reduced-pressure condition during the high-frequency bias sputtering process. In the sputtering chamber structure, the protection plate further has a second opening which is formed separately from the first opening to decentralize target power in the inner space defined by the protection plate when the high-frequency bias sputtering process is effected such that the first opening is closed by the substrate electrode.

8 Claims, 4 Drawing Sheets

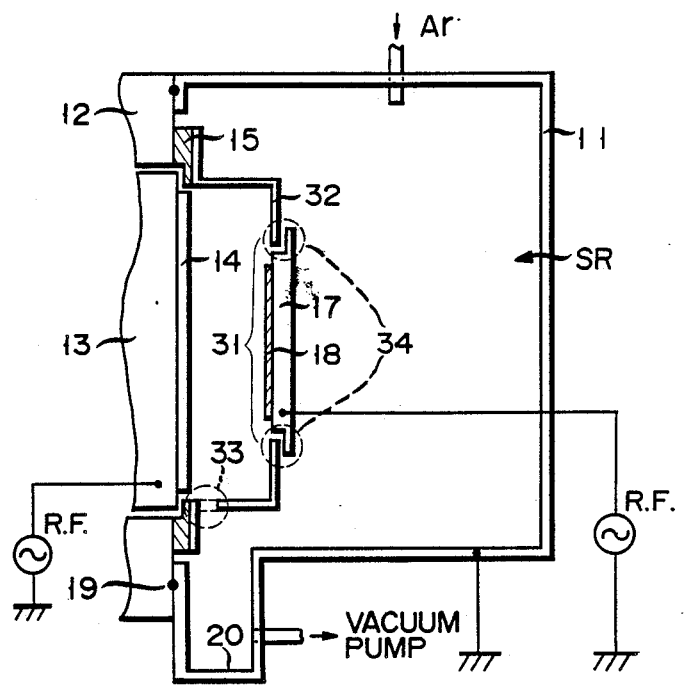
F I G. 5
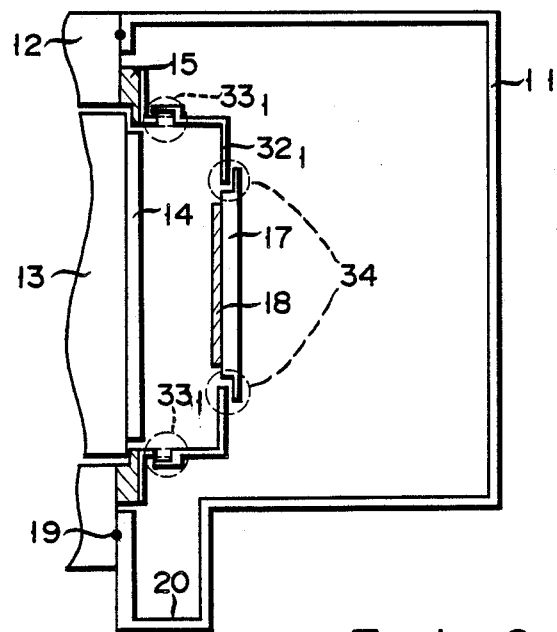
F I G. 6

SPUTTERING CHAMBER STRUCTURE FOR HIGH-FREQUENCY BIAS SPUTTERING PROCESS

BACKGROUND OF INVENTION

1. Field of the Invention

This invention relates to a semiconductor device manufacturing apparatus for forming an insulation film on a semiconductor substrate, and more particularly to a sputtering chamber structure in which a high-frequency bias sputtering process is effected to form the insulation film.

2. Description of the Related Art

In a multi-layered wiring process for a semiconductor device, an interlayer insulation film is formed by using a single wafer type high-frequency bias sputtering device, for example. The high-frequency sputtering device is used to effect sputtering onto a semiconductor wafer substrate including a plurality of partially fabricated semiconductor devices so as to form a relatively thick single insulation film as interlayer insulation films of the semiconductor devices. The sputtering process is effected by bombarding particles such as $Ar^+$ ions onto a target material and depositing resulting particles emitted from the target material on a semiconductor wafer substrate placed on the opposite side thereof. In the process, $Ar^+$ ions also bombard the semiconductor substrate so that the substrate can have a smooth surface. In recent bias sputtering devices, a permanent magnet or electromagnet is provided on the rear side of the target plate and the distance between the semiconductor wafer substrate and the target plate is reduced to several tens of mm so that the film formation speed can be enhanced.

FIG. 1 is a cross sectional view showing the sputtering chamber structure of the conventional single wafer type high-frequency bias sputtering device dedicated to the formation of an insulation film. The sputtering device has target electrode 13 to which target 14 is attached. Semiconductor wafer substrate 18 is first placed at a position opposite target 14 in the sputtering chamber SR, placed on substrate electrode 17 and then pivoted as shown by an arrow in FIG. 1. As a result, when substrate electrode 17 is disposed to face target 14, the surfaces of the substrate electrode and the target are parallel to each other. After this, a first high-frequency power is applied between target electrode 13 and chamber wall 11, and a second high-frequency power is applied between substrate electrode 17 and chamber wall 11.

In the sputtering device, metal protection plate 16 is formed along the outer peripheral portion of target 14 in order to block those sputtered particles which are not deposited on semiconductor wafer substrate 18. However, metal protection plate 1 cannot block all of such particles, and it is impossible to prevent sputtered particles from being deposited on the chamber wall 11 of sputtering chamber SR.

FIG. 2 shows an example of an empirically modified metal protection plate 21 of the sputtering device shown in FIG. 1. In this case, target 14 is surrounded by metal protection plate 21 having an opening in a portion facing target 14. The opening is substantially closed by means of substrate electrode 17 when semiconductor wafer substrate 18 is disposed facing target 14.

However, when metal protection plate 21 is used to prevent the sputtered particles from being deposited on chamber wall 11 of sputtering chamber SR, plasma (for example, of Ar ions) will be concentrated in the gap 22 between electrode 17 and metal protection plate 21. As a result, the sputter-etching rate in a partial area of semiconductor wafer substrate 18 at which plasma density is high is increased. For this reason, an insulation film formed on semiconductor wafer substrate 18 tends to have nonuniform thickness.

In the case where a 5-inch substrate 18 is used and disposed at a distance of 60 mm from target 14 and at a distance of 5 mm from metal protection plate 21 having an opening of 140 mm diameter, an insulation film was formed on substrate 18 by effecting the sputtering process under the following conditions: Ar partial pressure was at 0.30 pa, Ar flow rate was 30 SCCM, the target power was 3.0 kW, the substrate power was 0.5 kW, and a permanent magnet for generating a magnetic field having a field component parallel to and near the surface of cathode plate 13 was used. Curve b in FIG. 3 shows the results of measuring the film formation speeds for each of the portions of semiconductor wafer substrates 18 which were spaced from the peripheral edge by more than 5 mm and are in a single line extending across the center of substrate 18. In this case, the film formation speed was 80 nm/min, and the uniformity of the speed of sputtering for the substrate varied within a range of ±40% as shown by curve b in FIG. 3. Further, in the case where metal protection plate 21 was not provided, the film formation speed and the uniformity of sputtering speed were 95 nm/min and ±5% as shown by curve a in FIG. 3. Thus, in this case, good uniformity was obtained. Twenty five semiconductor substrates 18 were each subjected to the film formation process for 10 minutes under the same conditions as described before but without using protection plate 21. Then, another substrate 18 was horizontally positioned in a reduced-pressure Ar atmosphere before effecting the film formation process. A particle check was effected before and after film formation by sputtering. As shown by point d in FIG. 4, approx. 8000 particles of 0.3 $\mu$m or more in diameter were deposited on the last substrate 18 as dust. The number is relatively large when considering that only 60 particles were present before the film formation was effected. This is mainly because the sputtered film formed on chamber wall 11 is removed by temperature variation. If such a large number of particles are deposited on substrate 18, the particles will be included in a film formed in a succeeding sputtering process. Therefore, a decrease in the breakdown voltage, an increase in the film leakage current, and short circuit(s) in the upper wiring layers may be caused and the reliability will be lowered.

SUMMARY OF THE INVENTION

An object of this invention is to provide a sputtering chamber structure which can prevent sputtered particles from being dispersed to various locations other than a substrate without affecting uniformity in the thickness of a film formed by the high-frequency bias sputtering process.

This object can be attained by a sputtering chamber structure comprising:

first and second electrodes to which the target and semiconductor substrate are attached, respectively;

a protection plate formed to surround the target and having a first opening facing the front surface of the target and a second opening which is formed separately from the first opening defined by the protection plate when the high-frequency bias sputtering process is effected with the first opening section closed by the second electrode; and a vacuum chamber for receiving the first and second electrodes and the protection plate in a reduced-pressure condition during the high-frequency bias sputtering process.

According to the above sputtering device, plasma can pass out via the second opening. Since the second opening is formed separately from the first opening, plasma will not be concentrated at or near the edge portion of the semiconductor wafer substrate. Further, sputtered particles can be prevented from falling from the top wall of the chamber onto the semiconductor wafer substrate by forming the second opening in a suitable position, for example, in a lower portion of the protection plate below the target.

BRIEF DESCRIPTION OF THE DRAWINGS

FIG. 5 is the sputtering chamber structure of a single wafer type high-frequency bias sputtering device according to one embodiment of this invention; and FIGS. 6 to 8 are modifications of the sputtering chamber structure of FIG. 5 in which the protection plate is modified.

DETAILED DESCRIPTION OF THE PREFERRED EMBODIMENTS

Figure 1:
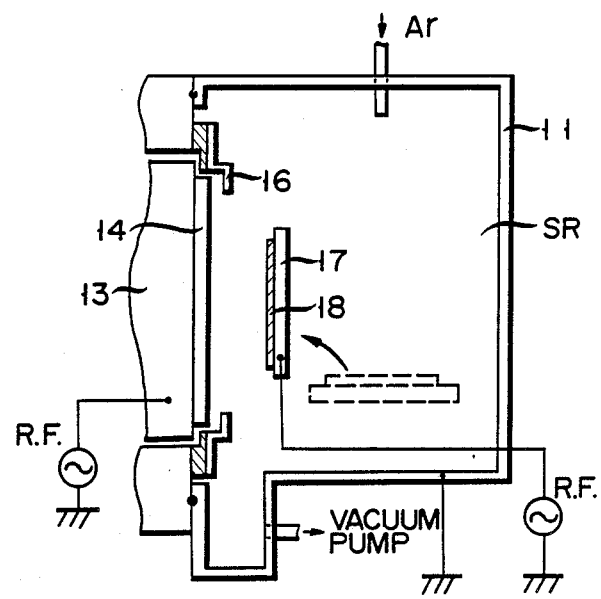
FIG. 1 is a cross sectional view showing the sputtering chamber structure of a conventional single wafer type high-frequency bias sputtering device.
Figure 2:
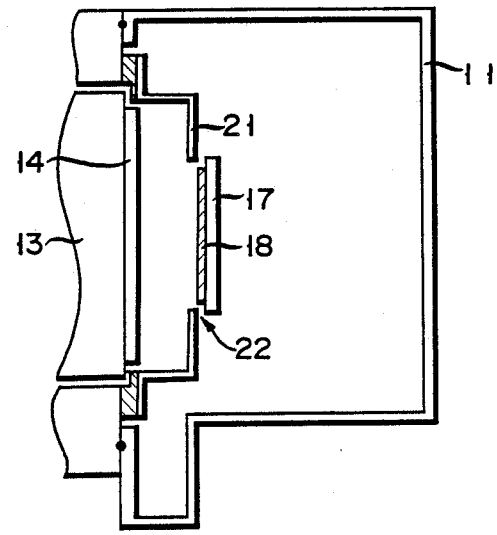
FIG. 2 shows an example of a sputtering chamber structure in which a metal protection plate of the sputtering device shown in FIG. 1 is empirically modified.

There will now be described an embodiment of the sputtering chamber structure of a high-frequency bias sputtering device according to one embodiment of this invention with reference to FIG. 5. In FIG. 5, portions which are the same as those of the conventional sputtering device are denoted by the same reference numerals. The sputtering device includes chamber wall 11, target flange 12 and backing plate or target electrode 13, and the space defined by these elements is denoted as sputtering chamber SR. Target 14 is mounted on backing plate 13 and kept substantially vertical. Target ground shield 15 is mounted along the periphery of target 14. The sputtering device further includes recess 20 formed in the bottom portion of chamber SR, O-ring 19 provided between chamber 11 and flange 12 and domed metal protection plate 32 removably attached to target ground shield 15. A vacuum pump (not shown) is communicated with recess 20. O-ring 19 is used to maintain the pressure in sputtering chamber 11 at a present degree of vacuum. Target 14 is surrounded substantially entirely by metal protection plate 32. Protection plate 32 has an opening 31 formed to face target 14 and opening 33 formed below target 14 and separate from opening 31. Opening 31 is formed to have a diameter slightly larger than semiconductor wafer substrate 18, and opening 33 is formed to have a diameter smaller than that of opening 31. Opening 31 is closed by substrate electrode 17 on which semiconductor wafer substrate 18 is held. Opening 33 is so formed that plasma can pass out from the space defined between substrate 18 and target 14 via opening 33, thus decentralizing the target power.

In order to prevent occurrence of a gap when opening 31 is closed by means of electrode 17 so as to dispose substrate 18 in parallel with target 14, stepped extension portions 34 are formed on electrode 17 to overlap the edge portion of protection plate 32.

In the embodiment of FIG. 6, target power decentralizing opening $33_1$ are formed in a meandering configuration so as to prevent sputtered particles from being scattered to the outer space SR via opening $33_1$. That is, curved gaps are formed in the mounting portion of protection plate $32_1$. Plasma may be discharged via the gaps to the exterior, but sputtering particles which tend to move in straight line paths will be prevented from being discharged via the gap to the chamber SR.

Figure 7:
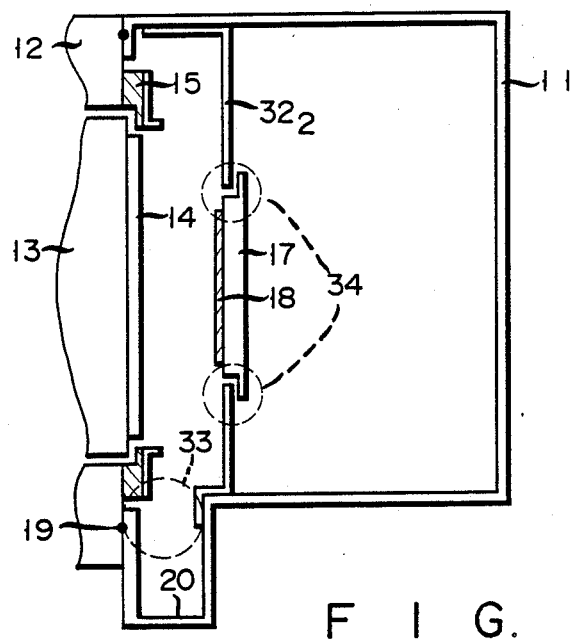

In the embodiment of FIG. 7, protection plate $32_2$ is mounted on chamber wall 11 and thus is in the form of a partition wall.

Figure 8:
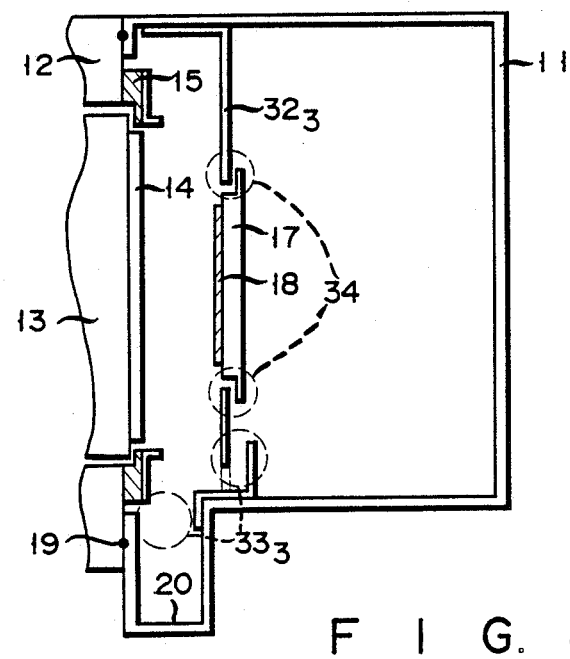

In the embodiment of FIG. 8, protection plate $32_3$ is mounted on chamber wall 11 and thus is also in the form of a partition wall. However, a plurality of target power decentralizing openings $33_3$ are formed in plate $32_3$ at different locations.

The embodiments will now be described in more detail. A high-frequency bias sputtering device was used with domed protection plate 32 mounted on target ground shield 15 to form a film on substrate 18. Target 14 and substrate 18 were disposed to face each other and inclined at an angle of 3° with respect to the vertical plane during film formation, the distance between target 14 and substrate 18 was 60 mm, the target material was high purity quartz, the target diameter of substrate electrode 17 was 160 mm. The inner diameter of protection plate 32 was 250 mm, the height was 60 mm, the diameter of the opening on the wafer substrate side was 170 mm, and stepped extension portions 34 were formed on the periphery of substrate electrode 17 to cover the gap formed between protection plate 32 and substrate electrode 17 (FIG. 5). The dimensions of opening 33 were 10 mm×100 mm, and opening 33 was formed on the lower side of protection plate 32. Further, recess 20 with a width of 60 mm was formed in the bottom portion of the sputtering chamber, and recess 20 was connected to a vacuum pump (not shown).

The film formation process was conducted on twenty-five wafer substrates 18 of 5 inch diameters under conditions where Ar gas was introduced into the sputtering chamber after the pressure thereof was reduced to $1.0 \times 10^{-4}$ pa and the Ar partial pressure was set at 0.30 pa, Ar flow rate was set at 30 SCCM, the target power was set at 3.0 kW, the substrate power was set at 0.5 kW (with the use of a permanent magnet), and the sputtering time was set at 10 minutes.

Figure 3:
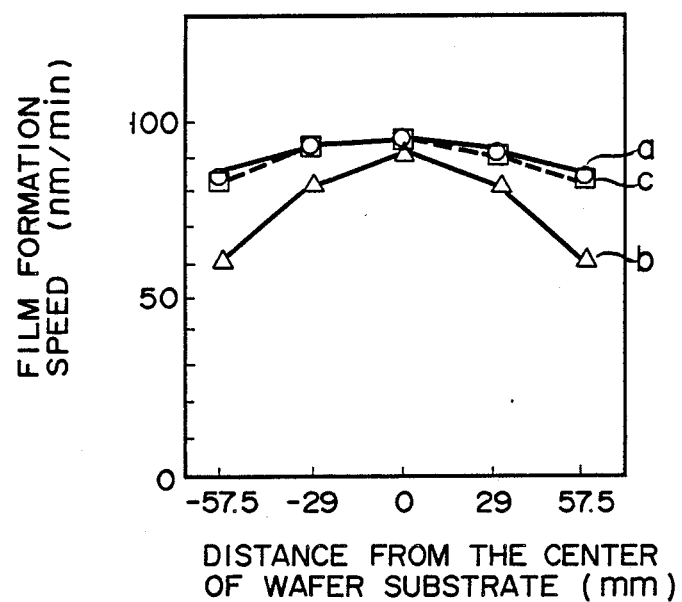
FIG. 3 shows film formation speed characteristics in the conventional sputtering device.

The result is shown by curve c in FIG. 3. As is seen from FIG. 3, the uniformity of the film formation speed is considerably improved. Further, the number of particles removed from the sputtering chamber and deposited on substrate 18 was checked before and after the film formation process. The result was good as shown by broken line e in FIG. 4.

In order to prevent sputtered particles from target 18 from reaching chamber wall 11, the target power decentralizing opening of protection plate 32 may be formed in an overlapped form as shown by openings $33_1$ in FIG. 6. In this case, plasma may pass out via openings 33₁, but substantially the same effect can be obtained.

Further, in cases where the protection plate is formed in the form of a partition plate as shown by protection plate 32₂ and 32₃ in FIGS. 7 and 8, the same effect can be obtained. A plurality of target power decentralizing openings 33₃ are provided as shown in FIG. 8, but if they are provided approx. 40 mm apart from wafer 18, the distribution of the film formation speed in the substrate will not be lowered due to an increase in the speed of sputter-etching of local portions of the insulation film on the substrate.

Figure 4:
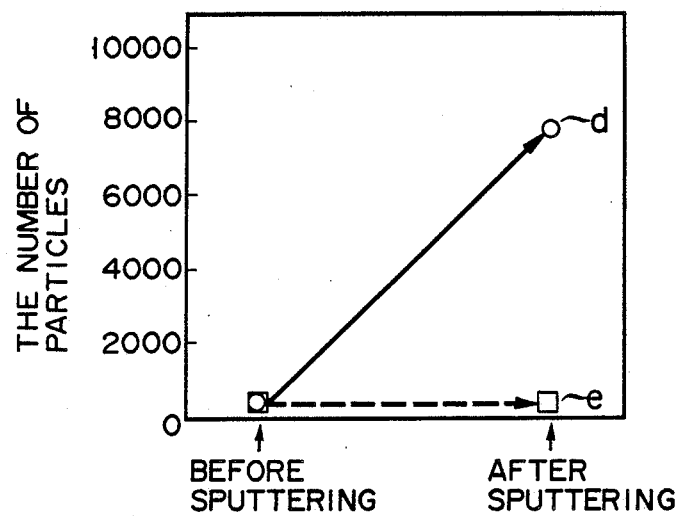
FIG. 4 shows variation in the number of sputtered particles deposited on the semiconductor wafer substrate in the reduced-pressure Ar atmosphere.

In this invention, preferably values of 94 nm/min and ±6% were obtained as the film formation speed and the uniformity (Vmax-Vmin)/(Vmax+Vmin)(Vmax is the maximum deposition speed and Vmin is the minimum deposition speed) of the speed of sputtering onto the substrate. Thus, the characteristics were significantly improved in comparison with characteristics curve b in FIG. 3. Further, the number of particles which had a diameter larger than 0.3 μm and were dropped onto substrate 18 by feeding substrate 18 in the reduced-pressure Ar atmosphere was checked before and after the film formation process. The number of particles was changed from 60 for each substrate (before the film formation process) to 214 for each substrate (after the film formation process). That is, the increase in the number of particles due to the film formation process can be significantly suppressed (FIG. 4). Further, in the embodiments of FIGS. 6 to 8, it was determined that the same effect can be attained.

In the case where a protection plate having no target power decentralizing opening is used and a film is formed on a substrate on which Al-Si wiring layers are formed, the target power decentralizing effect cannot be attained and the Al-Si wiring layer may be decomposed or changed in quality by a temperature rise due to the concentration of plasma in the peripheral portion of the substrate, thus deteriorating the quality of the semiconductor device. For this reason, it is necessary to use opening(s) 33 or the like.

As described above, according to this invention, a second opening is formed in the protection plate and the peripheral portion of the protection plate defining the first opening is partly overlapped on the outer peripheral portion of the substrate electrode so that plasma can be prevented from leaking out via the gap between the substrate electrode and the protection plate. Therefore, the sputtering speed can be made uniform, permitting an insulation film to be formed with a uniform thickness on the entire portion of the substrate. Further, since sputtered particles can be reliably blocked by means of the protection plate, they will not be deposited on the inner wall of the sputtering chamber. Thus, occurrence of particles due to peel-off or separation of a film formed on the inner wall of the sputtering chamber can be prevented. The insulation film can be formed on any part inside the space defined by the protection plate, and the sputtered film thus formed can be prevented from being peeled off by adequately selecting the material of the protection plate surface and the electrode surface. For example, the electrode surface and the protection plate can be formed of quartz ($SiO_2$) for this purpose. Thus, particles can be sufficiently prevented from being deposited on the substrate and entering into the sputtering film in the space defined by means of the protection plate.

Further, since the protection plate can be replaced, maintenance thereof can be easily effected in comparison with cleaning the inner wall of the sputtering chamber.

What is claimed is:

1. A sputtering chamber structure adapted to perform a high-frequency bias sputtering process for forming an insulation film on a semiconductor substrate by depositing thereon particles emitted from a target formed of insulative material, comprising:

first and second facing electrodes to which the target and semiconductor substrate are adapted to be attached, respectively;

a protection plate formed to surround said target and having a first opening facing the front surface of said target and at least one second opening formed separately from said first opening to decentralize target power in the inner space defined by said protection plate when said high-frequency bias sputtering process is effected, said first opening being closed off by said second electrode; and a vacuum chamber for receiving said first and second electrodes and said protection plate and adapted to be in a reduced-pressure condition during said high-frequency bias sputtering process.

2. A sputtering chamber structure according to claim 1, wherein said second electrode has stepped peripheral portions which overlap the edge portions of said protection plate which define said first opening.

3. A sputtering chamber structure according to claim 2, wherein said at least one second opening includes a curved gap for discharging plasma from said inner space and blocking the particles emitted from said target.

4. A sputtering chamber structure according to claim 2, wherein said at least one second opening is formed at a position below said target.

5. A sputtering chamber structure according to claim 1, wherein said at least one second opening comprises a plurality of openings.

6. A sputtering chamber structure according to claim 1, wherein said at least one second opening comprises a plurality of openings.

7. A sputtering chamber structure according to claim 1, wherein said at least one second opening includes a curved gap for discharging plasma from said inner space and blocking the particles emitted from said target.

8. A sputtering chamber structure according to claim 1, wherein said at least one second opening is formed at a position below said target.

* * * * *

UNITED STATES PATENT AND TRADEMARK OFFICE
CERTIFICATE OF CORRECTION

PATENT NO. : 4,897,172

DATED : January 30, 1990

INVENTOR(S) : Toshihiko Katsura et al.

It is certified that error appears in the above-identified patent and that said Letters Patent is hereby corrected as shown below:

ON TITLE PAGE:

Under Foreign Application Priority Data change "Mar. 26, 1987" to --August 26, 1987--.

Signed and Sealed this

Twenty-first Day of May, 1991

Attest:

HARRY F. MANBECK, JR.

Attesting Officer

Commissioner of Patents and Trademarks